United States Patent
Hsu et al.

[11] Patent Number: 6,143,467
[45] Date of Patent: Nov. 7, 2000

[54] PHOTOSENSITIVE POLYBENZOXAZOLE PRECURSOR COMPOSITIONS

[75] Inventors: Steve Lien-Chung Hsu, Tainan, Taiwan; Pamela J. Waterson, Northbridge, Mass.; Ahmad Naiini, Warwick; William D. Weber, Cranston, both of R.I.; Sanjay Malik, Attleboro; Andrew J. Blakeney, Seekonk, both of Mass.

[73] Assignee: Arch Specialty Chemicals, Inc., Norwalk, Conn.

[21] Appl. No.: 09/404,904

[22] Filed: Sep. 24, 1999

Related U.S. Application Data

[60] Provisional application No. 60/102,924, Oct. 1, 1998.
[51] Int. Cl.[7] ............................ G03F 7/004; C08F 283/04; C08L 77/10
[52] U.S. Cl. ...................... 430/270.1; 430/326; 430/330; 430/906; 430/176; 525/425; 525/433
[58] Field of Search ............................ 430/270.1, 906, 430/326, 330, 176; 525/425, 433

[56] References Cited

U.S. PATENT DOCUMENTS

| | | | |
|---|---|---|---|
| 4,371,685 | 2/1983 | Ahne et al. | 528/73 |
| 4,845,183 | 7/1989 | Mueller et al. | 528/185 |
| 4,954,610 | 9/1990 | Chen, Sr. et al. | 528/350 |
| 5,104,960 | 4/1992 | Inbasekaran et al. | 528/125 |
| 5,114,826 | 5/1992 | Kwong | 430/192 |
| 5,346,804 | 9/1994 | Pawlowski et al. | 430/281.1 |
| 5,346,806 | 9/1994 | Pawlowski et al. | 430/284.1 |
| 5,380,881 | 1/1995 | Ulrich Schadeli | 549/415 |
| 5,385,809 | 1/1995 | Bohrer et al. | 430/311 |
| 5,449,584 | 9/1995 | Banba et al. | 430/190 |
| 5,506,088 | 4/1996 | Nozaki et al. | 430/270.1 |
| 5,558,978 | 9/1996 | Schadeli et al. | 430/270.1 |
| 5,580,695 | 12/1996 | Murata et al. | 430/270.1 |
| 5,624,787 | 4/1997 | Watanabe et al. | 430/270.1 |
| 5,629,134 | 5/1997 | Oikawa et al. | 430/270.1 |
| 5,629,135 | 5/1997 | Kobayashi et al. | 430/270.1 |
| 5,667,938 | 9/1997 | Bantu et al. | 430/270.1 |
| 5,679,497 | 10/1997 | Kimura | 430/296 |
| 5,691,112 | 11/1997 | Watanabe et al. | 430/270.1 |
| 5,693,452 | 12/1997 | Aoai et al. | 430/270.1 |
| 5,700,624 | 12/1997 | Thackeray et al. | 430/270.1 |
| 5,731,125 | 3/1998 | Yamachika et al. | 430/270.1 |
| 5,731,126 | 3/1998 | Takemura et al. | 430/270.1 |

*Primary Examiner*—John S. Chu
*Attorney, Agent, or Firm*—Ohlandt, Greeley, Ruggiero & Perle, L.L.P.

[57] ABSTRACT

A heat resistant positive-working photosensitive composition that has a polybenzoxazole precursor bearing acid labile functional groups, a photoacid generator, a photosensitizer, and a solvent. The polybenzoxazole precursor bearing acid labile functional groups, has the structure:

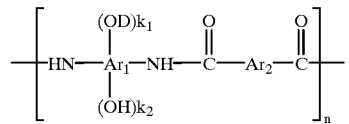

wherein $k_1$ is an integer of 1 or 2, $k_2$ is an interger of 0 or 1, and the sum of $k_1$ and $k_2$ is 2; $Ar_1$ is a tetravalent aromatic, aliphatic, or heterocyclic group, or mixtures thereof; $Ar_2$ is a divalent aromatic, aliphatic, or heterocyclic group or siloxane group; D is a monovalent acid labile group; and n is an integer from 20 to 200. A portion of $Ar_1$ can be a divalent aromatic, aliphatic, or heterocyclic diamine moiety such that the fraction of diamine compound is 0–60 mole percent and the sum of diamine and diamino dihydroxy compound is 100%.

Preparation of chemical amplification based positive-working, aqueous base developable photosensitive polybenzoxazole (PBO) precursors, the formulation of the resin composition, and the process for preparing heat-resistant relief structures from this resin composition. The positive photosensitive resin compositions are suitable especially for applications in microelectronics.

26 Claims, No Drawings

PHOTOSENSITIVE POLYBENZOXAZOLE PRECURSOR COMPOSITIONS

This application claims priority from U.S. Provisional Application Ser. No. 60/102,924 filed on Oct. 1, 1998.

FIELD OF THE INVENTION

The present invention relates to positive photosensitive resin compositions suitable for use in microelectronic applications. More particularly, the present invention relates to the synthesis of chemical amplification based positive-working, aqueous base developable photosensitive polybenzoxazole (PBO) precursors, the formulation of this resin composition and the process for preparing heat-resistant relief structures from this resin composition.

BACKGROUND OF THE INVENTION

Conventional positive-working photosensitive polybenzoxazole compositions contain an alkaline soluble PBO precursor and a diazoquinone photoactive compound as disclosed in U.S. Pat. No. 4,371,685. The diazoquinone compound inhibits the solubility of the PBO precursor in an aqueous base. However, after exposure to light, the diazoquinone compound undergoes photolysis and converts to indene carboxylic acid which promotes the solubility of the PBO precursor in the aqueous base.

BRIEF SUMMARY OF THE INVENTION

The present invention is a heat resistant positive-working photosensitive composition that contains a polybenzoxazole precursor bearing acid labile functional groups, a photoacid generator, and a solvent. Optionally, the composition may contain a photosensitizer, an adhesion promoter, a leveling agent, or other additives. The polybenzoxazole precursor bearing acid labile functional groups has the general structure:

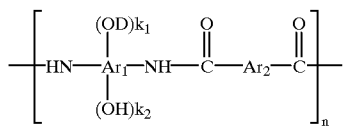

wherein $k_1$ is an integer of 1 or 2, $k_2$ is an interger of 0 or 1, and the sum of $k_1$ and $k_2$ is 2; $Ar_1$ is a tetravalent aromatic, aliphatic, or heterocyclic group, or mixtures thereof; $Ar_2$ is a divalent aromatic, aliphatic, or heterocyclic group or siloxanes group; D is a monovalent acid labile group; and n is an integer from 20 to 200. A portion of $Ar_1$ can be a divalent aromatic, aliphatic, or heterocyclic diamine moiety such that the fraction of diamine compound is 0–60 mole percent and the sum of diamine and diamino dihydroxy compound is 100%.

The present invention also relates to the preparation of chemical amplification based positive-working, aqueous base developable photosensitive polybenzoxazole precursors, the formulation of the resin compositions, and the process for preparing heat-resistant relief structures from these resin compositions.

DETAILED DESCRIPTION OF THE INVENTION

The present invention is based on photoacid catalyzed cleavage of chemically amplified protected polybenzoxazole precursors. The aqueous base solubility of the PBO precursor is reduced by protection of the aromatic hydroxyl group in the PBO precursor by attachment of acid labile groups. Restoration of the polymer alkali solubility is accomplished through the action of an acid produced by photolysis of a photoacid generator (PAG). The protecting groups can be any suitable acid labile group, such as acetals, ketals, carbonates, ethers, silyl ethers, moieties containing t-butyl esters, mixtures thereof, and the like. Using this concept, a positive-working photosensitive resin composition comprising a PBO precursor bearing acid labile functional groups, a photoacid generator, and a solvent can be prepared. Optionally, the composition may contain a photosensitizer. After photolithographic processing, the patterned layer is converted to a heat resistant polybenzoxazole coating by application of additional heating. The resin composition can be used in the manufacturing of microelectronic devices such as thermal and mechanical stress buffer coatings, alpha particle barrier films, interlayer dielectrics, and patterned engineering plastic layers.

The present invention provides a positive working photosensitive resin composition containing a PBO precursor bearing acid labile functional groups, having the general formula (A):

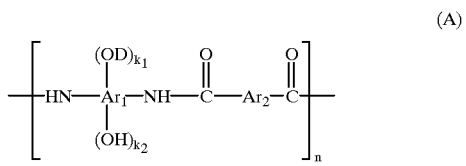

(A)

wherein $k_1$ is an integer of 1 or 2, $k_2$ is an interger of 0 or 1, and the sum of $k_1$ and $k_2$ is 2, and n is an integer from 20 to 200. $Ar_1$ is a tetravalent aromatic group, aliphatic group, heterocyclic group, or mixtures thereof, which includes but is not limited to moieties with the structure:

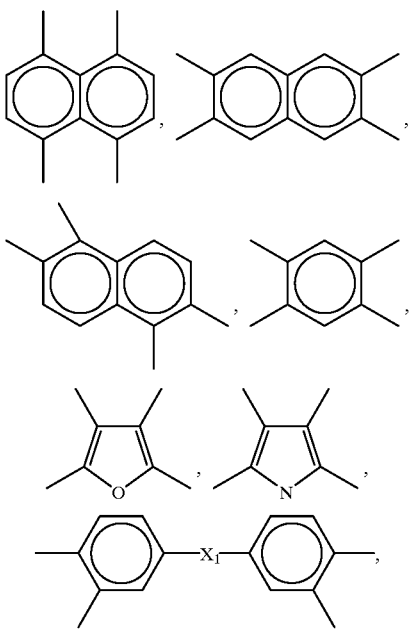

-continued

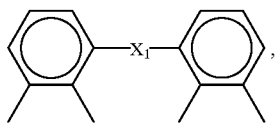

wherein $X_1$ is —O—, —S—, —C(CF$_3$)$_2$—, —C(CH$_3$)$_2$—, —CH$_2$—, —SO$_2$—, —NHCO—,

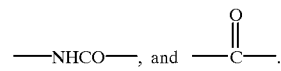, and

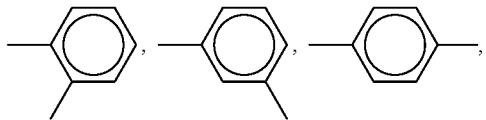 wherein Z = H or alkyl,

In addition, a portion of Ar$_1$ can be a divalent aromatic, aliphatic, or heterocyclic diamine moiety such that the fraction of diamine compound is 0–60 mole percent and the sum of diamine and diamino dihydroxy compound is 100%.

Ar$_2$ is a divalent aromatic group, aliphatic group, heterocyclic group, siloxane group, or mixtures thereof, which includes but is not limited to moieties with the structure:

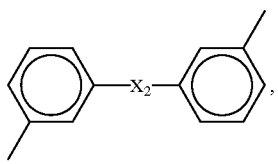

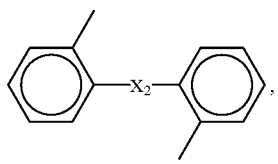

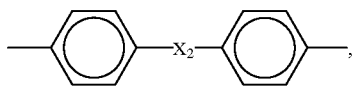

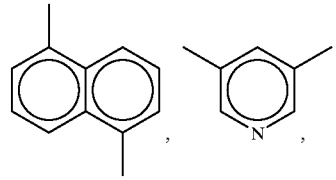

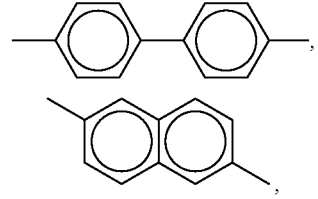

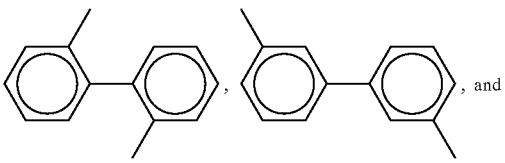, and

—C—C—, —C—O—, and

—(CH$_2$)p—Si—O—Si—(CH$_2$)p— wherein Z = H or alkyl and p is an integer from 1 to 6, and wherein $X_2$ is —O—, —S—, —C(CF$_3$)$_2$—, —C(CH$_3$)$_2$—, —CH$_2$—, —SO$_2$—, —NHCO—, and —C—.

The polymer may contain one or more different Ar$_1$ and Ar$_2$ groups.

D is any suitable monovalent acid labile group, such as acetals, ketals, carbonates, ethers, silyl ethers, moieties containing t-butyl esters, mixtures thereof, which includes but is not limited to moieties of the formula:

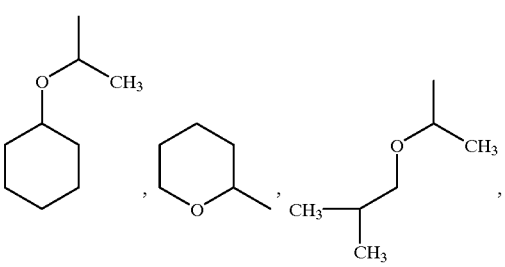

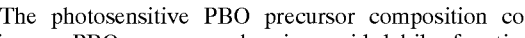

The photosensitive PBO precursor composition comprises a PBO precursor bearing acid labile functional groups, a photoacid generator, and a solvent. Optionally, the composition may contain a photosensitizer, an adhesion promoter, a leveling agent, or other additives. After exposure to light, the photogenerated acid catalyzes deblocking of the protected PBO precursor, and converts it to an aqueous base soluble PBO precursor as shown in Reaction (1).

Reaction (1)

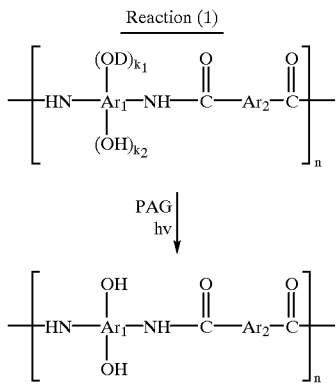

Any suitable photoacid generator compounds may be used in the photosensitive resin composition. Preferred photoacid generator compounds include, for example, triazine compounds, sulfonates, disulfones, onium salts, and mixtures thereof. Most preferred are onium salts such as iodonium, sulfonium, phosphonium, diazonium, sulfoxonium, and mixtures thereof. Also, preferred, photoacid generators include those which can be used in g-line, i-line, 248 nm, and broadband lithography.

The solvent used in this resin composition should be inert, should dissolve all components in the composition and should be removed on drying after coating. Any suitable solvent may be used and include, for example, organic solvents such as N-methyl-2-pyrrolidinone (NMP), γ-butyrolactone (GBL), diglyme, tetrahydrofuran (THF), dimethyl-2-piperidone (DMPD), and mixtures thereof. Most preferred is γ-butyrolactone.

A photosensitizer or dye may be added to the photosensitive resin composition to increase the absorption of the composition to the actinic radiation wavelength. Any suitable, photosensitizer may be used and may, for example, be a fluorenone derivative, naphthalene, anthracene derivative, coumarine, pyrene derivative, benzil, fluorescein derivative, benzophenone, benzanthrone, xanthone, phenothiazine, and mixtures thereof.

The photosensitive resin composition may further comprise additives such as adhesion promoters and surfactants. Examples of preferred adhesion promoters are aminosilane derivatives and polyamic acids containing siloxane groups.

The PBO precursor is prepared by reacting aromatic diamino dihydroxy compounds, one or more aromatic or aliphatic diamines, and one or more aromatic or aliphatic acids. Examples of suitable acids are aromatic or aliphatic dicarboxylic acids and dicarboxylic acid chlorides. The synthesized PBO precursor can be a homopolymer or a copolymer.

The PBO precursor bearing acid labile functional groups, shown in Formula (A) may be derived from the reaction of a PBO precursor with a vinyl ether having the formula $R^1$=CH—$OR^2$ in the presence of an acid catalyst, wherein $R^1$ is (a) a linear, branched or cyclic alkylene group preferably having 1 to 10 carbon atoms, (b) a linear, branched or cyclic haloalkylene group preferably having 1 to 10 carbon atoms, or (c) an aralkylene group. $R^2$ is a linear, branched, cyclic alkyl, aralkyl, or linear or branched alkyl group bearing cycloalkyl, substituted cycloalkyl, aryl, and substituted aryl groups, preferably having 1 to 10 carbon atoms. Another suitable method of deriving the PBO precursor bearing acid labile functional groups, is from the reaction of the PBO precursor with a di-t-butyl dicarbonate in the presence of a base. The PBO precursor bearing acid labile functional groups, can also be synthesized by reacting the PBO precursor, an alcohol, and a t-butyl vinyl ether in the presence of an acid.

The PBO precursor may have the general formula (B) shown below:

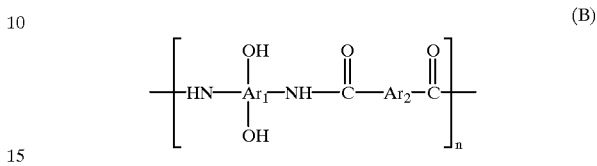

wherein $Ar_1$ is a tetravalent aromatic group, aliphatic group, heterocyclic group, or mixtures thereof; $Ar_2$ is a divalent aromatic group, aliphatic group, heterocyclic group, siloxane group, or mixtures thereof; and n is an integer from 20 to 200. A portion of $Ar_1$ can be a divalent aromatic, aliphatic, or heterocyclic diamine moeity such that the fraction of diamine compound is 0–60 mole percent and the sum of diamine and diamino dihydroxy compound is 100%.

The acetal protected PBO precursors can be prepared by the acid catalyzed addition reaction of vinyl ethers and PBO precursors. Any suitable acid catalyst may be used for the reaction, for example, hydrochloric acid, p-toluene sulfonic acid and pyridium-p-toluene sulfonate. The acid catalyst may be added in amounts ranging from about 0.001 weight percent to about 3.0 weight percent. Several vinyl ethers with a range of activation energies toward acid induced deprotection can be used in this reaction. Protected polymers useful in this invention may also be prepared using a process consisting of the acid catalyzed reaction of a PBO precursor, t-butyl vinyl ether, and an alkyl-, alkylene-, cycloalkyl-, or arylalkyl-alcohol.

A typical synthetic reaction mechanism for production of an acetal protected PBO precursor is shown in reaction (2):

Reaction (2)

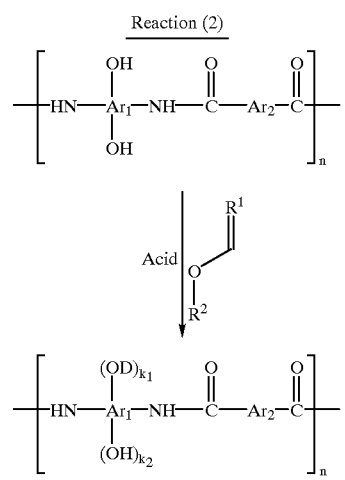

wherein $R^1$ is defined as before, D is defined as before but excludes the t-butoxycarbonyl group, ethers, silyl ether, and carbonates, and $R^2$ is for example: t-butyl, isobutyl, ethyl, cyclohexyl, ethyl cyclohexyl, or phenethyl. However, $R^2$ is not restricted to these groups, but can be any group as previously defined. The PBO precursor may contain one or more of $Ar_1$ and $Ar_2$. In further regard to Reaction (2), $k_1$ is an integer of 1 or 2, $k_2$ is an interger of 0 or 1, and the sum of $k_1$ and $k_2$ is 2, and n is an integer from 20 to 200. A portion of $Ar_1$ can be a divalent aromatic, aliphatic, or heterocyclic diamine moiety such that the fraction of diamine compound is 0–60 mole percent and the sum of diamine and diamino dihydroxy compound is 100%.

The degree of protection or blocking level by acid labile groups can be adjusted by the molar ratio of vinyl ether and PBO precursor, the reaction temperature, the reaction time and the type of acid catalyst. PBO precursors with different blocking levels showed different dissolution rates in the aqueous base developers. For example, a PBO precursor powder with 92% t-butyl vinyl ether blocking groups was not soluble in both 0.262N tetramethylammonium hydroxide (TMAH) and 0.145N TMAH solutions. In contrast, a PBO precursor powder with 31% t-butyl vinyl ether blocking groups was not soluble in 0.145N TMAH but was soluble in 0.262N TMAH solution. Finally, a PBO precursor powder with 18% t-butyl vinyl ether blocking groups was soluble in both 0.262N TMAH solution and 0.145N TMAH solution. Thus, the solubility of a protected PBO precursor can be controlled by the blocking level, which can be varied from about 1% to 100%.

The present invention also includes a process for the preparation of a heat-resistant relief image. The process comprises the steps of: (a) coating on a suitable substrate, a heat resistant positive-working photosensitive composition comprising a polybenzoxazole precursor bearing acid labile functional groups, a photoacid generator, and a solvent, thereby forming a coated substrate; (b) exposing the coated substrate to actinic radiation; (c) post exposure baking the coated substrate at an elevated temperature, preferably between about 50° C. and 150° C.; (d) developing the coated substrate with an aqueous developer, thereby forming a developed substrate; and (e) baking the developed substrate at an elevated temperature, preferably between about 250° C. to 400° C. to convert the polybenzoxazole precursor to a polybenzoxazole. The heat resistant positive-working photosensitive composition may further include a photosensitizer. Optionally, the coated substrate may undergo a prebaking step, after the coated substrate is formed and before exposing the coated substrate. In a preferred embodiment, the polybenzoxazole precursor bearing acid labile functional groups has the structure:

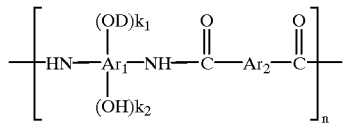

wherein $k_1$ is an integer of 1 or 2, $k_2$ is an interger of 0 or 1, and the sum of $k_1$ and $k_2$ is 2; $Ar_1$ is a tetravalent aromatic, aliphatic, or heterocyclic group, or mixtures thereof; $Ar_2$ is a divalent aromatic, aliphatic, or heterocyclic group or siloxane group; D is a monovalent acid labile group; and n is an integer from 20 to 200.

In the first step in applying the resin composition, the positive acting, photosensitive compositions of this invention are coated on a suitable substrate such as a silicon wafer, a ceramic substrate and the like. Coating methods include but are not limited to spin coating, roller coating, offset printing, screen printing, extrusion coating, meniscus coating, curtain coating, dip coating, and spray coating. The resulting film may optionally be prebaked at a temperature of 70–120° C. for several minutes to evaporate the solvent. Subsequently, the resulting film is exposed to actinic rays through a mask. X-rays, electron beam, ultraviolet rays, visible lights and the like can be used as actinic rays. The most preferable rays are those with wavelength of 436 nm (g-line) and 365 nm (i-line).

Following exposure to actinic radiation, it is advantageous to heat the coated substrate to a temperature between about 50° C. and 150° C. The coated substrate is heated within this temperature range for a short period of time, typically several seconds to several minutes. This process step is commonly referred to in the art as post exposure baking.

The film is developed by an aqueous developer and a relief pattern is obtained. The aqueous developer includes the solution of alkalis such as an inorganic alkali (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The most preferable developers are those containing tetramethylammonium hydroxide. An appropriate amount of a surfactant can be added to the developer. Development can be carried out by means of immersion, spray, puddling, or other similar developing methods.

The relief pattern is then rinsed using deionized water. The oxazole ring is then formed by curing of the relief pattern to obtain the final pattern of high heat resistant polymer. Curing is performed by baking the developed substrate at 250° C. to 400° C. to convert the polybenzoxazole precursor to a polybenzoxazole.

To illustrate the present invention, the following examples are provided. It should be understood that the present invention is not limited to the examples described.

SYNTHESIS EXAMPLE A

Synthesis of a PBO Precursor

To a 100 mL three-necked round bottom flask equipped with a mechanical stirrer, nitrogen inlet and addition funnel, 3.66 g (0.010 mol) of hexafluoro-2,2-bis(3-amino-4-hydroxyphenyl)propane, 1.70 g (0.021 mol) of pyridine and 15 g of N-methylpyrrolidinone (NMP) were added. The solution was stirred at room temperature until it was clear and then cooled in an ice water bath at 0–5° C. To this solution, 2.03 g (0.010 mol) of isophthalyl chloride dissolved in 5 g of NMP was added drop-wise. After the addition, the resulting mixture was stirred at room temperature for 18 hours. The viscous solution was precipitated in 800 mL of de-ionized water. The polymer was collected by filtration and washed with deionized water and then with a 50/50 water/methanol mixture. The polymer was dried under vacuum at 105° C. for 24 hours.

The yield was almost quantitative and the inherent viscosity of the polymer was 0.28 dL/g measured in NMP at the concentration of 0.5 g/dL at 25° C.

Example 1

Synthesis of t-butyl vinyl ether protected PBO precursor

To a 250 mL three necked flask equipped with a nitrogen inlet and a magnetic stirrer, 7.5 grams of PBO precursor obtained from the reaction of Synthesis Example A, 67.5 grams of diglyme were added. After the polymer was dissolved, 6.06 grams of t-butyl vinyl ether was added. After stirring for 10 minutes, the reaction mixture was cooled to 0–5° C. by an ice bath and then 0.15 gram of p-toluenesulfonic acid was added slowly. The reaction temperature was then raised to room temperature. After stirring at room temperature for 2 hours, 0.3 gram of triethylamine in 6 grams of diglyme was added to quench the reaction. The reaction mixture was precipitated in 1200 mL of de-ionized water. The polymer was collected by filtration and washed with de-ionized water twice. The polymer was dried in a vacuum oven at 60° C. for 24 hours. $^1$H-NMR showed that 65% of hydroxyl groups of the PBO precursor were protected as acetals.

Example 2
Preparation of photoresist formulation and lithographic evaluation

A photoacid generator (4-methoxy-α-[[[(4-methylphenyl) sulfonyl]oxy]imino]-benzeneacetonitrile), 0.1 gram, and 0.03 g of FLUORAD FC 430 surfactant (a fluorinated alkyl ester available from the 3M Company (1 w/w % in propylene glycol monomethyl ether acetate)) was dissolved in 8 grams of γ-butyrolactone in an amber bottle. After dissolution of the photoacid generator compound and surfactant, 2 grams of acetal protected PBO precursor of Example 1 was added. The solution was mixed homogeneously and filtered through a 0.8 μ filter. The solution was spin coated onto a silicon wafer at 800 rpm and prebaked at 100° C. for 3 minutes. The coating was exposed to 1000 mJ/cm$^2$ from an unfiltered mercury arc lamp measured @ 400 nm and post baked at 85° C. for 2 minutes. The wafer was developed in a 0.145N TMAH developer. After a 350° C. bake for 60 min in a nitrogen atmosphere, a heat resistant relief pattern was obtained showed a resolution of 2–4 micron line and space, via, and post patterns.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A positive-working photosensitive composition comprising:
   a polybenzoxazole precursor bearing acid labile functional groups;
   a photoacid generator;
   a solvent; and
   optionally, a photosensitizer.

2. The positive-working photosensitive composition of claim 1, wherein said polybenzoxazole precursor bearing acid labile functional groups has the structure:

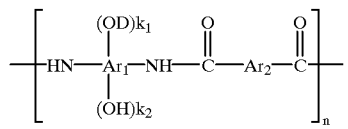

wherein $k_1$ is an integer of 1 or 2, $k_2$ is an interger of 0 or 1, and the sum of $k_1$ and $k_2$ is 2; $Ar_1$ is a tetravalent aromatic, aliphatic, or heterocyclic group, or mixtures thereof; $Ar_2$ is a divalent aromatic, aliphatic, or heterocyclic group or siloxane group; D is a monovalent acid labile group; and n is an integer from 20 to 200.

3. The composition of claim 2, wherein $Ar_1$ is a hexafluoro propane-2,2(biphenyl) radical and $Ar_2$ is a phthaloyl radical.

4. The positive-working photosensitive composition of claim 2, wherein said monovalent acid labile group D is selected from the group consisting of acetals, ketals, carbonates, ethers, silyl ethers, moieties containing t-butyl ester groups, and mixtures thereof.

5. The positive-working photosensitive composition of claim 2, wherein said monovalent acid labile group D is selected from the group consisting of:

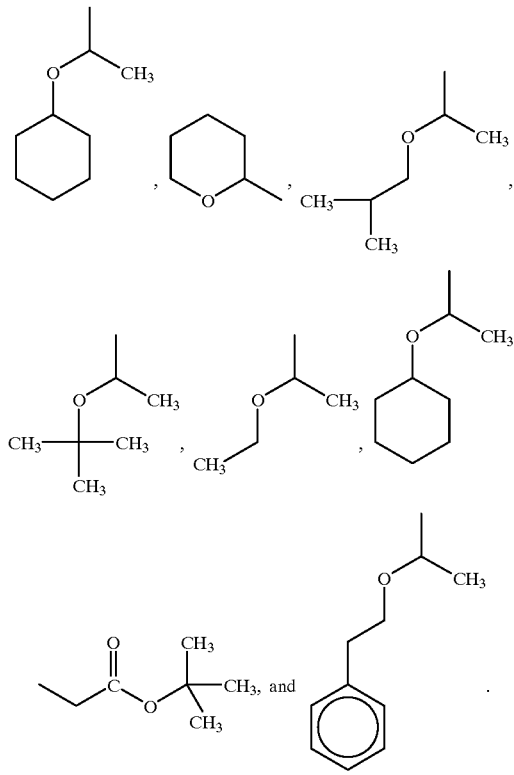

6. The positive-working photosensitive composition of claim 1, wherein said photoacid generator is selected from the group consisting of triazine compounds, sulfonates, disulfones, onium salts, and mixtures thereof.

7. The positive-working photosensitive composition of claim 6, wherein said photoacid generator is an onium salt selected from the group consisting of iodonium salt, sulfonium salt, phosphonium salt, diazonium salt, sulfoxonium salt, and mixtures thereof.

8. The positive-working photosensitive composition of claim 1, wherein said photosensitizer is a fluorenone derivative, naphthalene, anthracene derivative, coumarine, pyrene derivative, benzil, fluorescein derivative, benzophenone, benzanthrone, xanthone, phenothiazine, and mixtures thereof.

9. The positive-working photosensitive composition of claim 1, wherein said solvent is selected from the group consisting of N-methyl-2-pyrrolidinone, γ-butyrolactone, diglyme, tetrahydrofuran, dimethyl-2-piperidone, and mixtures thereof.

10. The positive-working photosensitive composition of claim 9, wherein said solvent is γ-butyrolactone.

11. The positive-working photosensitive composition of claim 1, further comprising:
   at least one component selected from the group consisting of an adhesion promoter, a surfactant, and mixtures thereof.

12. The positive-working photosensitive composition of claim 11, wherein said component is an adhesion promoter comprising a polyamic acid containing siloxane groups.

13. A photosensitive resin comprising:
a polybenzoxazole precursor bearing acid labile functional groups having the structure:

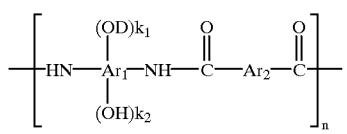

wherein $k_1$ is an integer of 1 or 2, $k_2$ is an interger of 0 or 1, and the sum of $k_1$ and $k_2$ is 2; $Ar_1$ is a tetravalent aromatic, aliphatic, or heterocyclic group, or mixtures thereof; $Ar_2$ is a divalent aromatic, aliphatic, or heterocyclic group or siloxane group; D is a monovalent acid labile group selected from the group consisting of acetals, ketals, carbonates, ethers, silyl ethers, moieties containing t-butyl ester groups and mixtures thereof; n is an integer from 20 to 200, where a portion of $Ar_1$ can be a divalent aromatic, aliphatic, or heterocyclic diamine moiety such that the fraction of diamine compound is 0–60 mole % and the sum of diamine and diamino dihydroxy compound is 100%.

14. The photosensitive resin of claim 13, wherein said monovalent acid labile group D is selected from the group consisting of:

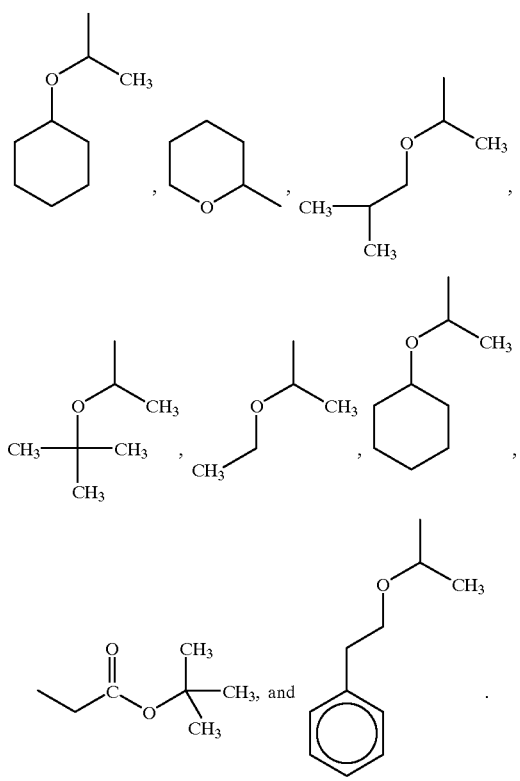

15. A process for preparing an polybenzoxazole precursor bearing acid labile functional groups having a blocking level about 1% to 100%, comprising one of the following steps of:
(a) reacting a polybenzoxazole precursor with a vinyl ether in the presence of an acid catalyst;
(b) reacting a polybenzoxazole precursor with a di-t-butyl dicarbonate in the presence of a base; or
(c) reacting a polybenzoxazole precursor, an alcohol, and a t-butyl vinyl ether in the presence of an acid.

16. The process of claim 15, wherein said polybenzoxazole precursor has the structure:

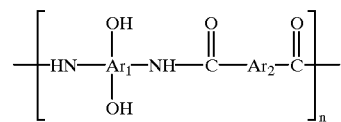

wherein $Ar_1$ is a tetravalent aromatic group, aliphatic group, heterocyclic group, or mixtures thereof; $Ar_2$ is a divalent aromatic group, aliphatic group, heterocyclic group, siloxane group, or mixtures thereof; and n is an integer from 20 to 200; where a portion of $Ar_1$ can be a divalent aromatic, aliphatic, or heterocyclic diamine moeity such that the fraction of diamine compound is 0–60 mole % and the sum of diamine and diamino dihydroxy compound is 100%; and wherein said vinyl ether has the formula:

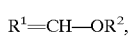

$$R^1 = CH - OR^2,$$

wherein $R^1$ is (a) a linear, branched or cyclic alkylene group having 1 to 10 carbon atoms, (b) a linear, branched or cyclic haloalkylene group having 1 to 10 carbon atoms, or (c) an aralkylene group; and $R^2$ is a linear, branched, cyclic alkyl, aralkyl, or linear or branched alkyl group bearing cycloalkyl, substituted cycloalkyl, aryl, and substituted aryl groups, preferably having 1 to 10 carbon atoms.

17. A process for the preparation of a heat-resistant relief image comprising the steps of:
a) coating on a substrate, a heat resistant positive-working photosensitive composition comprising an polybenzoxazole precursor bearing acid labile functional groups, a photoacid generator, and a solvent, thereby forming a coated substrate;
b) exposing said coated substrate to actinic radiation;
c) post exposure baking said coated substrate at an elevated temperature;
d) developing said coated substrate with an aqueous developer, thereby forming a developed substrate; and
e) baking said developed substrate at an elevated temperature to convert the polybenzoxazole precursor to a polybenzoxazole.

18. The process of claim 17, wherein said heat resistant positive-working photosensitive composition, further comprises a photosensitizer.

19. The process of claim 17, further comprising the step of prebaking said coated substrate, after said coated substrate is formed and before exposing said coated substrate.

20. The process of claim 17, wherein said actinic rays are selected from the group consisting of X-rays, electron beam rays, ultraviolet rays, and visible light rays.

21. The process of claim 17, wherein said actinic rays have a wavelength of 436 nm and 365 nm.

22. The process of claim 17, wherein said aqueous developer is a solution selected from the group consisting of alkalis, primary amines, secondary amines, tertiary amines, alcoholamines, quaternary ammonium salts, and mixtures thereof.

23. The process of claim 17, wherein said polybenzoxazole precursor bearing acid labile functional groups has the structure:

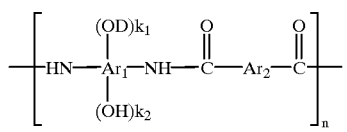

wherein $k_1$ is an integer of 1 or 2, $k_2$ is an interger of 0 or 1, and the sum of $k_1$ and $k_2$ is 2; $Ar_1$ is a tetravalent aromatic, aliphatic, or heterocyclic group, or mixtures thereof; $Ar_2$ is a divalent aromatic, aliphatic, or heterocyclic group or siloxane group; D is a monovalent acid labile group; and n is an integer from 20 to 200, where a portion of $Ar_1$ can be a divalent aromatic, aliphatic, or heterocyclic diamine moiety such that the fraction of diamine compound is 0–60 mole % and the sum of diamine and diamino dihydroxy compound is 100%.

24. The process of claim 23, wherein said monovalent acid labile group D is selected from the group consisting of acetals, ketals, t-butyl esters, carbonates, ethers, silylethers groups, and mixtures thereof.

25. The process of claim 23, wherein said monovalent acid labile group D is selected from the group consisting of:

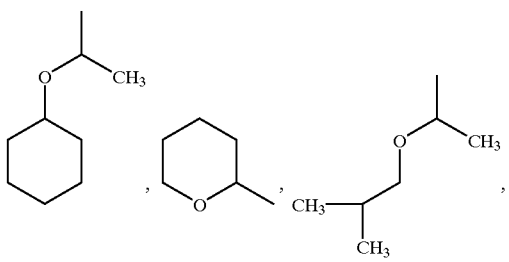

-continued

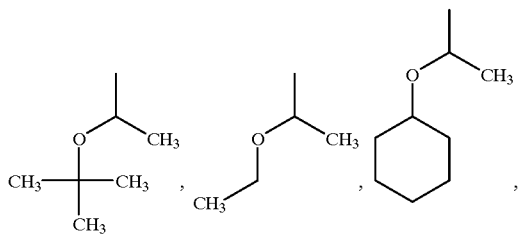

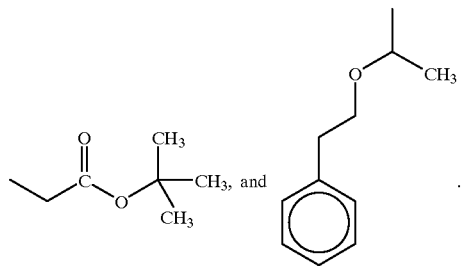

26. The process of claim 23, further comprising the step of prebaking said coated substrate, after said coated substrate is formed and before exposing said coated substrate.

* * * * *